United States Patent [19]

Shinohara et al.

[11] Patent Number: 5,008,206
[45] Date of Patent: Apr. 16, 1991

[54] METHOD FOR MAKING A PHOTOELECTRIC CONVERSION DEVICE USING AN AMORPHOUS NUCLEATION SITE

[75] Inventors: Mahito Shinohara, Tokyo; Takao Yonehara, Atsugi, both of Japan

[73] Assignee: Canon Kabushiki Kaisha, Tokyo, Japan

[21] Appl. No.: 357,635

[22] Filed: May 24, 1989

Related U.S. Application Data

[63] Continuation of Ser. No. 70,777, Jul. 7, 1987, abandoned.

[30] Foreign Application Priority Data

Jul. 11, 1986 [JP] Japan .................................. 61-162128

[51] Int. Cl.⁵ .................. H01L 21/20; H01L 31/18
[52] U.S. Cl. ........................... 437/3; 148/DIG. 26; 148/DIG. 152; 437/62; 437/83; 437/90; 437/976; 357/30
[58] Field of Search ............... 357/30, 34, 43, 30 I, 357/30 P, 30 D; 437/3, 2, 4, 62, 31, 41, 81, 82, 83, 84, 89, 90, 108, 173, 174, 915, 949, 963, 973, 976; 148/DIG. 3, 4, 8, 11, 25, 26, 48, 71, 90, 97, 152

[56] References Cited

U.S. PATENT DOCUMENTS

| | | | |
|---|---|---|---|
| 3,549,432 | 12/1970 | Sivertson | 437/108 |
| 3,620,833 | 11/1971 | Gleim et al. | 437/83 |
| 3,900,943 | 8/1975 | Sirtl | 437/83 |
| 4,131,496 | 12/1978 | Weitzel et al. | 156/613 |
| 4,174,422 | 11/1979 | Mathews et al. | 437/84 |
| 4,277,688 | 7/1981 | Abrahams et al. | 437/84 |
| 4,471,371 | 9/1984 | Hamano | 357/31 |
| 4,479,847 | 10/1984 | McCaldin et al. | 156/624 |
| 4,517,733 | 5/1985 | Hamano | 29/572 |
| 4,569,700 | 2/1986 | Toyama | 437/51 |
| 4,637,127 | 1/1987 | Kurogi et al. | 437/89 |
| 4,670,088 | 6/1987 | Tsaur et al. | 156/617 R |

FOREIGN PATENT DOCUMENTS

| | | | |
|---|---|---|---|
| 132076 | 1/1985 | European Pat. Off. | 357/30 |
| 0056406 | 4/1983 | Japan | 437/89 |
| 0090724 | 5/1983 | Japan | 437/83 |
| 0124222 | 7/1983 | Japan | 437/915 |
| 0028327 | 2/1984 | Japan | 437/89 |
| 0239932 | 10/1988 | Japan | 437/83 |
| 2044996 | 10/1980 | United Kingdom . | |

OTHER PUBLICATIONS

T. Yonehara, et al., "Competing Processes of Si Molecular Beam Reactive Etching and Simultaneous Deposition on Film and Bulk $SiO_2$", Journal of Applied Physics, vol. 53, No. 10, pp. 6839–6843 (Oct. 1982).

*Primary Examiner*—Olik Chaudhuri
*Assistant Examiner*—William Bunch
*Attorney, Agent, or Firm*—Fitzpatrick, Cella Harper & Scinto

[57] ABSTRACT

A photoelectric conversion apparatus comprising a transistor having a main electrode area of one conductive type semiconductor and a control electrode area of an opposite conductive type semiconductor, and a capacitor for controlling the potential of the control electrode area in floating state in which carriers produced optically are stored in the control electrode area by controlling the potential of the control electrode area via the capacitor. The apparatus comprises a multilayered structure in which switching device for setting the control electrode area to a desired potential is formed on a layer different from that on which the transistor and capacitor are formed.

6 Claims, 9 Drawing Sheets

FIG. 4A
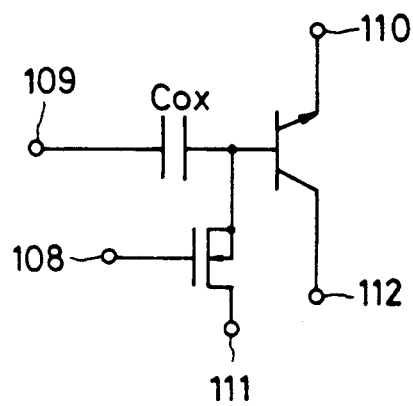
FIG. 5A
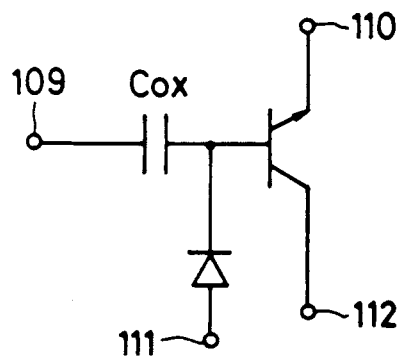
FIG. 4B
CARACITOR ECECTRODE 109 ⎯⎯⎯⎯⎯⎯⎻⎻⎻⎻⎻⎻⎻⎻ GND
GATE ELECTRODE 108 ⎯⎯⎯⎯⎯⎻⎻⎻⎻⎻⎻⎻⎻⎻ GND
FIG. 5B
CAPACITOR ELECTRODE 109 ⎯⎯⎯⎯⎯⎻⎻⎻⎻⎻⎻⎻ GND
ELECTRODE 111 ⎯⎯⎯⎯⎻⎻⎻⎻⎻⎻⎻⎻ GND

METHOD FOR MAKING A PHOTOELECTRIC CONVERSION DEVICE USING AN AMORPHOUS NUCLEATION SITE This application is a continuation of application Ser. No. 070,777, filed July 7, 1987, now abandoned.

BACKGROUND OF THE INVENTION

1. Field of the Invention

This invention relates to a photoelectric conversion apparatus having an electric charge storage area, the electric potential of which is controlled via a capacitor.

2. Related Background Art

FIG. 1A is a schematic plan view of one example of a photoelectric conversion apparatus disclosed in Laid-Open European Application No. 132076. FIG. 1B is a cross-sectional view taken along the line A—A' of FIG. 1A. FIG. 1C is an equivalent circuit diagram of the apparatus.

In FIGS. 1A and 1B, photoelectric conversion cells are arranged on an n-silicon substrate 101 in which each cell is electrically isolated from adjacent cells by a cell separation area 102 of $SiO_2$, $Si_3N_4$ or polysilicon or the like.

Each cell has the following structure: p-areas 104 and 105 are formed by doping p-type impurities, for example, of boron into an $n^-$-area 103 of low impurity density formed using epitaxial techniques, or the like, and an $n^+$-area 106 is formed in p-area 104 using impurity diffusion techniques, ion implantation techniques or the like.

The p-areas 104 and 105 are a source and a drain area of a p-channel MOS transistor while p-areas 104 and $n^+$-106 are a base and an emitter, respectively, of an npn-bipolar transistor. The p-area 104 is both the source of the p-channel MOS transistor and the base of an npn-bipolar transistor.

Formed on $n^-$-area 103, on which the respective areas are thus formed, is an oxide film 107 on which are formed the gate electrode 108 of a p-channel MOS transistor and a capacitor electrode 109 having a predetermined area. Capacitor electrode 109 opposes p-area 104 with oxide film 107 formed therebetween to form a capacitor.

In addition, an emitter electrode 110 connected to $n^+$-area 106, an electrode 111 connected to p-area 105 and a collector electrode 112 on the back of substrate 101 with an ohmic contact area disposed therebetween are formed.

The basic operation of this device will now be described. Assume first that the p-area 104 which is the base of the bipolar transistor is at an initial negative potential. Light enters p-area 104 to produce electron-positive hole pairs, the positive holes of which are stored in p-area 104 to raise the potential of p-area 104 in the positive direction.

Storage Operation

Thereafter, emitter electrode 110 is rendered floating and a positive read voltage pulse is applied to capacitor electrode 109. This causes the potential of p-area 104 which is the base of the transistor to rise to thereby apply a forward bias across the base and emitter. This causes a current, corresponding to a change in the base potential during storage operation, to flow through the emitter and collector. Therefore, an electric signal corresponding to the quantity of incident light appears on the floating emitter electrode 110 (reading operation). At this time, the quantity of electric charges stored in the base or p-area 104 do not substantially decrease, so that the same optical information can be read repeatedly.

A refresh operation to eliminate positive holes stored in p-area 104 will now be described.

FIGS. 2A and 2B are diagrams of voltage waveforms illustrating the refresh operation.

As shown in FIG. 2A, the MOS transistor is turned on only when a negative voltage higher than the threshold value is applied to gate electrode 108.

In FIG. 2B, in order to perform the refresh operation, emitter electrode 110 is grounded and electrode 111 is put at a ground potential. First, a negative voltage is applied to gate electrode 101 to turn on the p-channel MOS transistor. This causes the potential of p-base area 104 to be a constant value in spite of the level of the storage potential. Thereafter, a refresh positive voltage pulse is applied to capacitor electrode 109 to forwardly bias p-area 104 relative to $n^+$-area 106 to thereby eliminate the stored positive holes through the grounded emitter electrode 110. When the refresh pulse falls, p-area 104 is returned to its initial negative potential (refresh operation). As just mentioned above, since the potential of p-base area 104 is at a fixed potential by the MOS transistor, and a refresh pulse is then applied to nullify the remaining electric charges, a new storage operation can be performed without depending on the previously stored potential. Thus, the remaining charges can be nullified rapidly, thereby resulting in high speed operation. Thereafter, similarly, the respective storage, read and refresh operations will be repeated.

However, a problem with this device is that a bipolar transistor and a MOS transistor are formed in a single sensor cell, requiring the formation of many terminals and making it difficult to obtain a smaller structure in the conventional arrangement.

SUMMARY OF THE INVENTION

The main object of this invention is to provide a photoelectric conversion apparatus which eliminates the above conventional problems.

Another object of this invention is to provide a photoelectric conversion apparatus comprising a transistor having a main electrode area of one conductive type semiconductor and a control electrode area of an opposite conductive type semiconductor, and a capacitor for controlling the potential of the control electrode area in floating state in which carriers produced optically are stored in the control electrode area by controlling the potential of the control electrode area via the capacitor, comprising:

a multilayered structure in which switching means for setting the control electrode area to a desired potential is formed on a layer different from that on which the transistor and capacitor are formed.

BRIEF DESCRIPTION OF THE DRAWINGS

FIG. 4A is an equivalent circuit diagram of a second embodiment of this invention and FIG. 4B is a voltage waveform diagram for illustrating the refresh operation;

FIG. 5A is an equivalent circuit diagram of a third embodiment of this invention and FIG. 5B is a voltage waveform diagram for illustrating the refresh operation;

DETAILED DESCRIPTION OF PREFERRED EMBODIMENTS

Embodiments of this invention will now be described in more detail with reference to the drawings.

Figure 1A:
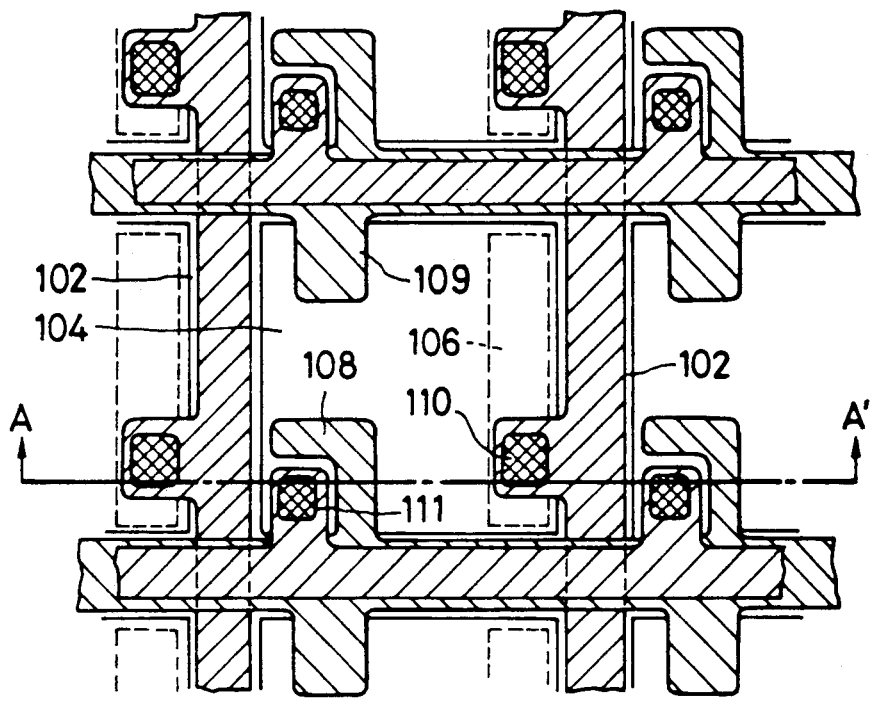
FIG. 1A is a schematic plan view of a conventional photoelectric conversion apparatus.
Figure 1B:
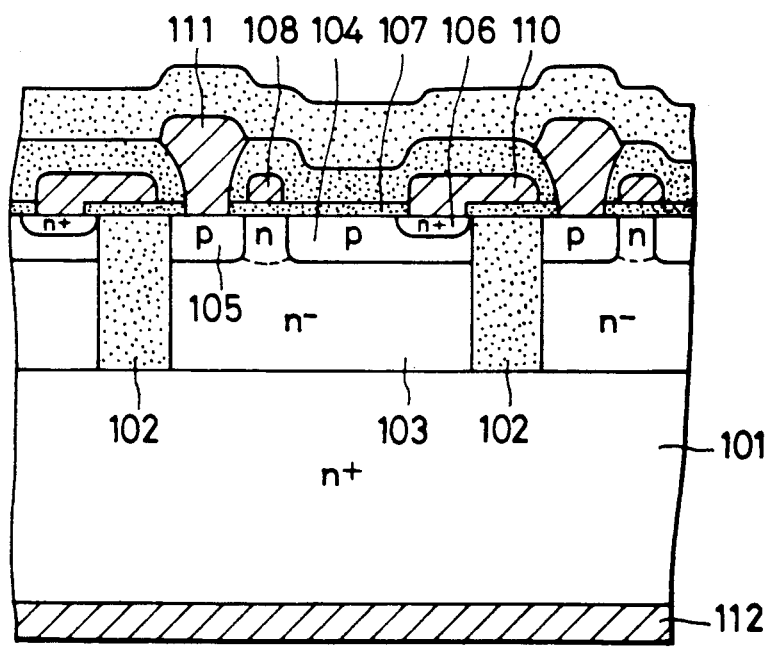
FIG. 1B is a cross-sectional view taken along the line A—A' of FIG. 1A.
Figure 1C:
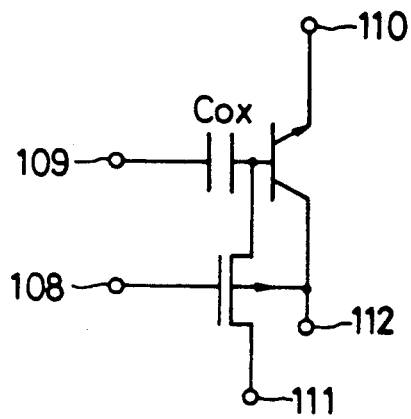
FIG. 1C is an equivalent cirucit diagram of the apparatus.
Figure 3A:
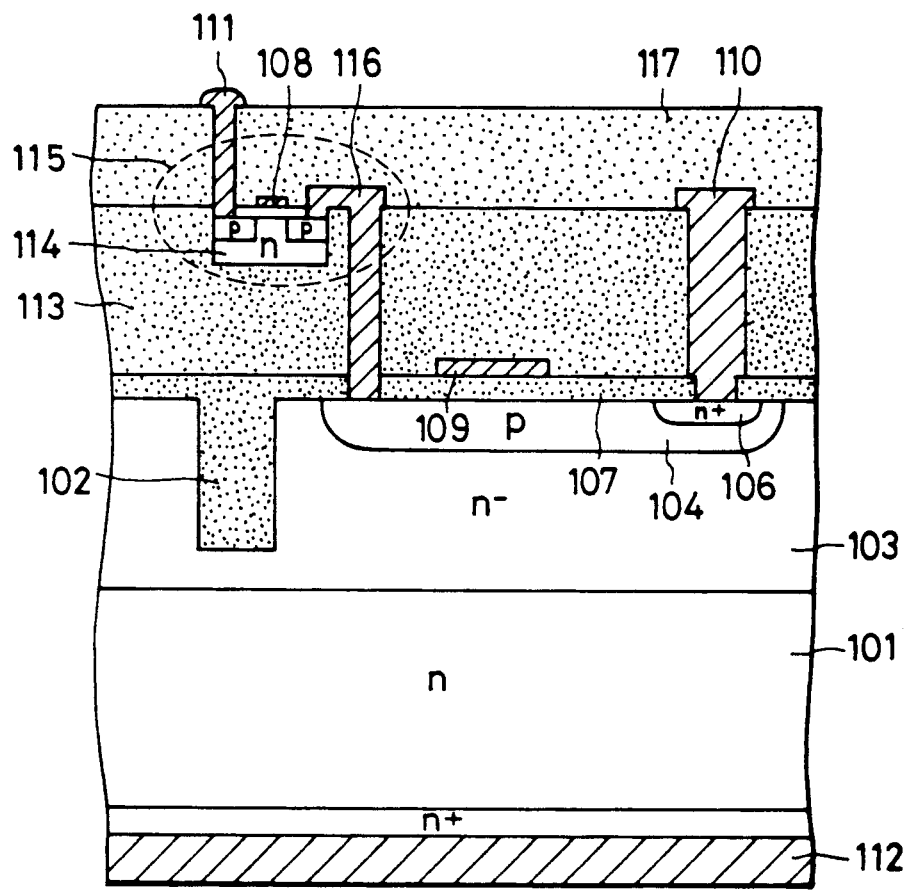
FIG. 3A is a schematic cross-sectional view of one embodiment of a photoelectric conversion apparatus according to this invention.
Figure 3B:
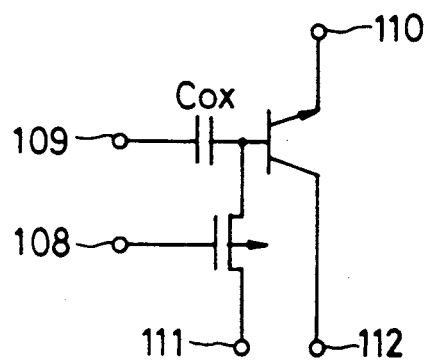
FIG. 3B is an equivalent circuit diagram of the apparatus.

FIG. 3A is a schematic cross-sectional view of one embodiment of a photoelectric conversion apparatus according to this invention, and FIG. 3B is an equivalent circuit diagram of the apparatus. Like parts are given the same reference numeral in FIG. 1 showing the prior art and in FIG. 3.

In FIG. 3A, an $n^-$-epitaxial layer 103 is formed on an n-substrate 101. Formed in area 103 is a p-base area 104 surrounded by a device separating area 102. The p-base area 104 has an $n^+$-emitter area 106 formed therein.

Formed on $n^-$-epitaxial layer 103, on which the various areas are formed, are an insulating layer 107 on which a capacitor electrode 109 is formed opposite to p-base area 104.

Formed on such bipolar transistor as a lower layer is an insulating layer 113 of $SiO_2$ or the like having a recess in which an n-type single crystal silicon 114 is grown using a single crystal growth method to be described in more detail later. A contact hole is formed in $n^+$-emitter area 106 to form emitter electrode 110.

Formed on the single crystal silicon layer 114, formed by single crystal growth method, are a gate oxide film, a gate electrode 108 and a source and a drain area to form a MOS transistor 115. The drain area is connected by a lead 116 to the lower p-base area 104. Formed on MOS transistor 115 is a passivation film 117 with the source area of MOS transistor 115 being connected to electrode 111.

An equivalent circuit of this embodiment having such structure is shown in FIG. 3B. If an electrode connected to n-type silicon layer 114 which is the substrate of MOS transistor 115 is formed and connected to electrode 112, the circuit will become the same as the prior art one. Therefore, the respective basic storage, read and refresh operations of this embodiment are the same as the prior art example as mentioned already above. Namely, in the refresh operation, when MOS transistor 115 is first turned on, the electric charges in p-base area 104 are eliminated from electrode 111 grounded via lead 116 and MOS transistor 115. After the p-base area 104 is thus set to a fixed potential, a refresh positive voltage pulse is applied to capacitor electrode 109 to nullify the remaining charges in p-base area 104.

If the electrode connected to n-type silicon layer 114 and electrode 111 are connected to each other, a simplified structure will be obtained which permits a refresh operation similar to the above refresh operation. This arrangement also has the advantage of allowing the excess charges stored in p-base area 104 to escape. This serves to prevent the occurrence of blooming when the area sensor is constructed.

FIG. 4A is an equivalent circuit diagram of a second embodiment of this invention and FIG. 4B shows a voltage waveform produced during the refresh operation.

This embodiment is obtained by replacing MOS transistor 115 in FIG. 3A with an n-channel MOS transistor. Namely, the other structure is the same as that of the first embodiment.

Since the transistor is of n-channel type, it is off when the gate electrode 108 potential is negative, while it is on only when the gate potential is higher than its threshold, as shown in FIG. 4B. Also, in this case, the refresh operation is performed, as described above.

FIG. 5A is an equivalent circuit diagram of a third embodiment of this invention and FIG. 5B illustrates the voltage waveform produced during the refresh operation.

In this embodiment, a diode is formed instead of MOS transistor 115. Namely, in FIG. 1A, a single crystal silicon is grown in a recess in insulating layer 113 to form a pn-junction. A lead 116 is connected to the n-area and electrode 111 is connected to the p-area.

According to this structure, even if the potential of p-base area 104 is raised during the read operation, a negative potential is applied to electrode 111 to thereby backwardly bias the diode, so that the stored charges in p-base area 104 are maintained. On the other hand, during the refresh operation, first, a voltage higher than the base level is applied to electrode 111 to forwardly bias the diode to thereby set the potential of p-base area 104 at a fixed value. Thereafter, a positive refresh voltage pulse is applied to capacitor electrode 109 to nullify the remaining charges.

Figure 6A:
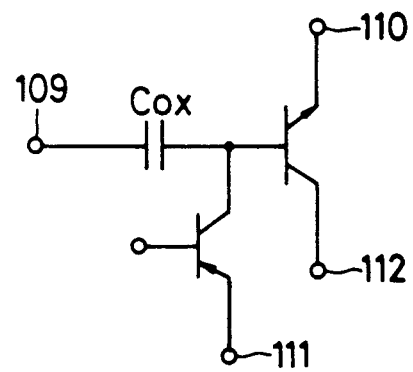
FIG. 6A is an equivalent circuit diagram of a fourth embodiment of this invention and FIG. 6B is a voltage waveform diagram for illustrating the refresh operation.
Figure 6B:
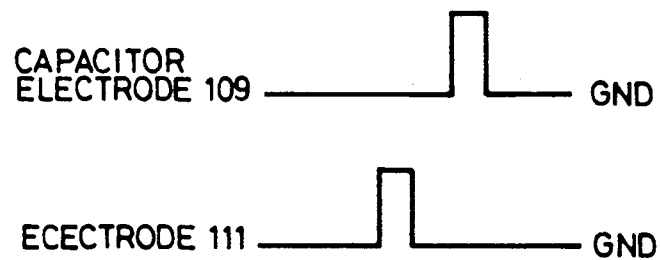

FIG. 6A is an equivalent circuit diagram of a fourth embodiment of this invention and FIG. 6B is a diagram of a voltage waveform produced during the refresh operation.

In this embodiment, a pnp-bipolar transistor is used instead of MOS transistor 115. Namely, a pnp-bipolar transistor is formed on a single crystal silicon layer 114 using a regular process, the p-collector area is connected by a lead 116 to p-base area 104 and the p-emitter area is connected to electrode 111. The n-base area is grounded.

In this arrangement, during the read operation, electrode 111 is at ground level and the pnp-bipolar transistor is not turned on although the potential of p-base area 104 is raised.

During the refresh operation, a positive voltage pulse is first applied to electrode 111 to turn on the pnp-bipolar transistor to thereby set p-base area 104 to a fixed potential. Thereafter, a positive refresh voltage pulse is applied to capacitor electrode 109 to nullify the charges remaining in p-base area 104.

A single crystal growth method which grows a single crystal silicon in a recess in insulating layer 113 will now be described in detail.

For better understanding of the present invention, first the general process for forming a thin film of metal for semiconductor is explained.

When the deposition surface is made of a material different in kind from the flying atom, particularly an amorphous material, the flying atoms are diffused freely on the substrate surface, or again evaporated (released). As the result of collision between the atoms, a nucleus is formed and when its size becomes the size rc ($=-2\sigma o/gv$) at which its free energy G becomes the maximum (critical nucleus), G is reduced and the nucleus continues to grow stably three-dimensionally and assumes the shape of in an island. The nucleus with the size exceeding rc is called a stable nucleus, and unless otherwise particularly noted, "nucleus" in the following basic description of the present invention refers to this "stable nuclei". Also, among "stable nucleus", those with small r are called "initial nuclei".

Figure 7:
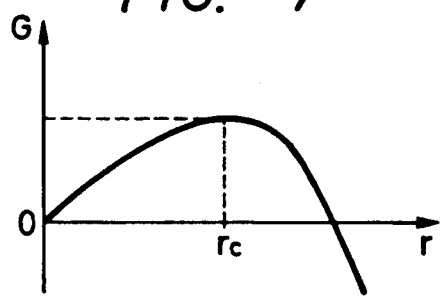
FIG. 7 is a graph for illustration of the relationship between the size of nucleus rc and free energy G in the process of forming a thin film.

The free energy generated by formation of nucleus is represented as follows:

$$G = 4\pi f(\theta)(\sigma o \; r^2 \frac{1}{3} \cdot gv \cdot r^3)$$

$$f(\theta) = \tfrac{1}{4}(2 - 3 \cos \theta + \cos^2 \theta)$$

wherein,
r = radius curvature of nucleus
$\theta$ = contact angle of nucleus
gv = free energy per unit deposition
$\sigma o$ = surface energy between nucleus and vacuum.
FIG. 7 shows the manner in which G is changed. In the same Figure, the radius of curvature of the stable nucleus when G is at the maximum value is rc.

Thus, nuclei grow to form islands, and further grow whereby contact mutually between islands progresses until some coalescence occurs and, via a network structure, the material becomes finally a continuous film to cover completely over the substrate surface. Following such a process, a thin film is deposited on the substrate.

In the deposition process as described above, the density of nucleus formed per unit area of the substrate surface, the size of nucleus and the nucleation speed are determined depending on the state of the system of deposition, and particularly the interaction between the flying atoms and the substrate surface material is an important factor. Also, a specific crystal direction grows in parallel to the substrate due to anisotropy relative to the crystal surface of the interface energy at the interface between the deposited material and the substrate, and when the substrate is amorphous, the crystal direction within the substrate plane is not constant. For this reason, grain boundaries are formed by collision mutually between nuclei or islands, and particularly in the case of collision mutually between islands with some sizes or greater, grain boundaries are formed as such rather than occurrence of coalescence. Since the grain boundaries formed are difficult to move in the solid phase, the grain sizes are determined at that point.

Next, the selective deposition method for forming a deposited film selectively on the deposition surface is to be described. The selective deposition method is a method in which a thin film is formed selectively on the substrate by utilizing the differences between the materials in factors influencing nucleus formation in the thin film forming process such as surface energy, attachment coefficient, release coefficient, surface diffusion speed, etc.

Figure 2A:
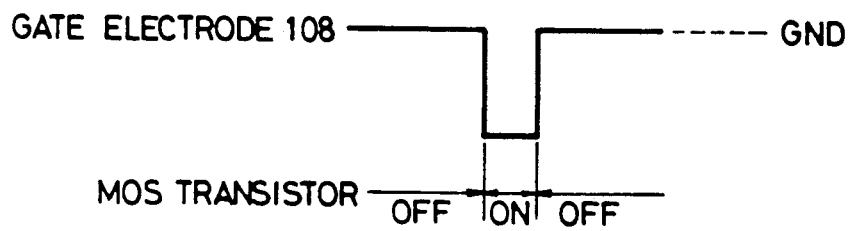
FIG. 2A is a voltage waveform diagram illustrating the operation of a MOS transistor.
Figure 2B:
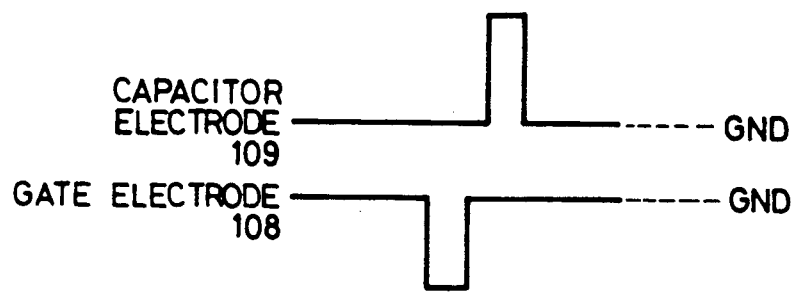
FIG. 2B is a voltage waveform diagram for illustrating the refresh operation.
Figure 8A:
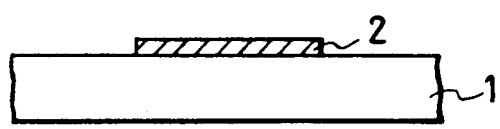
FIGS. 8A and 8B are illustrations of the selective deposition method.
Figure 8B:
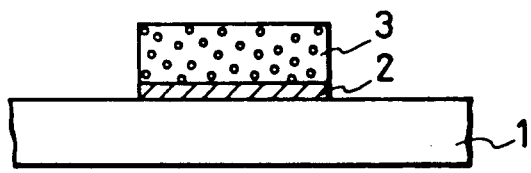

FIGS. 8A and 8B are illustrations of the selective deposition method. First, as shown in FIG. 2A on the substrate 1, a thin film 2 comprising a material different in the above factors from the substrate 1 is formed at a desired portion. And, when deposition of a thin film comprising an appropriate material is effected under appropriate deposition conditions, a thin film 3 grows only on the thin film 2, whereby it is possible to give rise to a phenomenon that no growth occurs on the substrate 1. By utilizing this phenomenon, the thin film 3 formed self-matchingly can be grown, whereby it becomes possible to omit the lithographic step using a resist as practiced in the prior art.

As the material for enabling deposition according to such selective formation method, for example, $SiO_2$ may be used as the substrate 1, Si, GaAs, silicon nitride as the thin film 2 and Si, W, GaAs, InP, etc., as the thin film 3 to be deposited.

Figure 9:
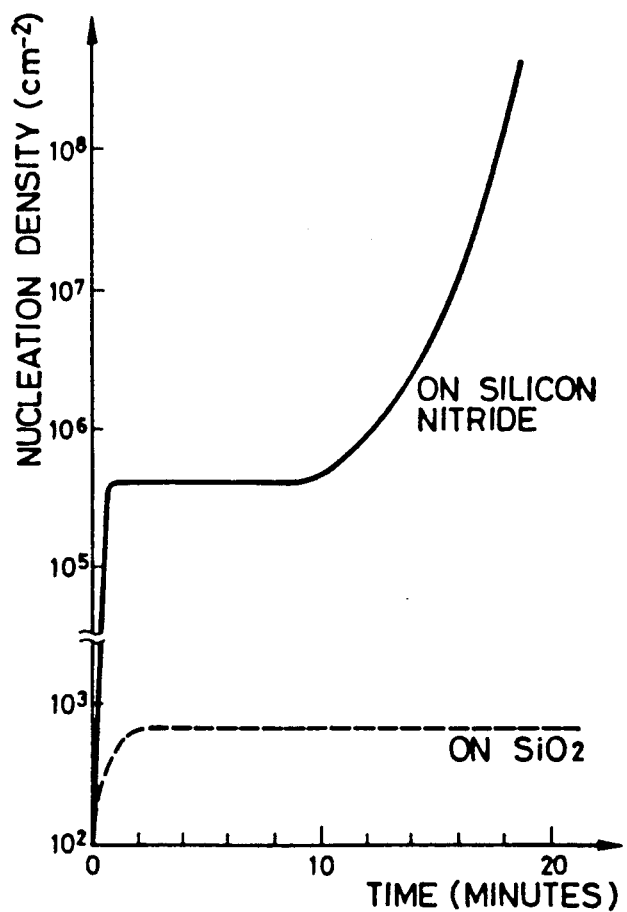
FIG. 9 is a graph showing the change with lapse of time of nucleation density (ND) on the deposition surface of $SiO_2$ and the deposition surface of silicon nitride.

FIG. 9 is a graph showing the change with lapse of time of nucleation density on the deposited surface of $SiO_2$ and the deposited surface of silicon nitride.

As shown in the same graph, soon after initiation deposition, the nucleation density on $SiO_2$ is saturated at $10^3$ cm$^{-2}$ or less, and the value is not substantially changed even after 20 minutes.

In contrast, on silicon nitride ($Si_3N_4$), the nucleation density is once saturated at about $4 \times 10^5$ cm$^{-2}$ or less, is not substantially changed 10 minutes thereafter, but is abruptly increased thereafter. This measurement example shows the case in which $SiCl_4$ gas is diluted with $H_2$ and deposited according to the CVD method under the conditions of a pressure of 170 Torr and a temperature of 1000° C. Otherwise, the same action can be obtained by use of $SiH_4$, $SiH_2Cl_2$, $SiHCl_3$, $SiF_4$, etc., as the reaction gas, and controlling the pressure, temperature, etc. Also, the vacuum vapor deposition can be employed.

In this case, nucleation on $SiO_2$ poses substantially no problem, but by addition of HCl gas into the reaction gas, nucleation on $SiO_2$ can be further suppressed to make deposition of Si on $SiO_2$ perfectly zero.

Such a phenomenon depends greatly on the difference in adsorption coefficient, release coefficient, surface diffusion coefficient, etc., relative to Si of the material surfaces of $SiO_2$ and silicon nitride, but the fact that $SiO_2$ itself is etched by the reaction of $SiO_2$ with Si atom itself to form silicon monooxide with higher vapor pressure, while no such etching phenomenon occurs on silicon nitride may be also considered to be a cause to effect selective deposition (T. Yonehara, S. Yoshioka, S. Miyazawa, Journal of Applied Physics 53, 6839, 1982).

Thus, by selecting $SiO_2$ and silicon nitride as the materials of the deposition surface and silicon as the material to be deposited, sufficiently great nucleation density difference as shown in the same graph can be obtained. Here, although SiO$_2$ is desirable as the material for the deposition surface, this is not limitative and sufficiently practical nucleation density difference can be obtained even by use of SiO$_x$ ($0 < X < 2$).

Of course, the present invention is not limited to these materials, but the difference in nucleation density ($\Delta$ND) may be sufficiently 10$^3$-fold or more in density of nuclei as shown by the same graph, and sufficient selective formation of deposited film can be done with the materials as examplified below.

As another method for obtaining this nucleation density difference ($\Delta$ND), ions of Si or N may be injected locally into the SiO$_2$ surface to form a region having excessive Si or N.

The present invention utilizes selective deposition based on such nucleation density difference ($\Delta$ND) and, by being formed sufficiently finely so that a single nucleus may grow on the deposition surface of a different kind of material having sufficiently greater nucleation density than the material of the deposition surface, a single crystal can be grown selectively only at the site where such fine different kind of material exists.

In this connection, since selective growth of a single crystal is determined depending on the electron state of the deposition surface, particularly the state of dangling bonds, the material with lower nucleation density (for example, SiO$_2$) is not required to be a bulk material, but it may be formed only on the surface of any desired material, substrate, etc., to form the above deposited surface.

In the following, the present invention is described in detail by referring to the drawings.

Figure 10A:
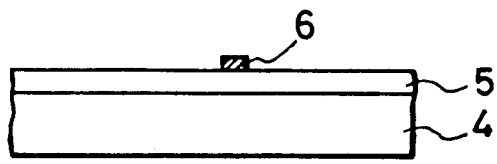
FIGS. 10A to 10D are illustrations of the formation steps showing a first embodiment of the method for forming crystal relating to the present invention.
Figure 10B:
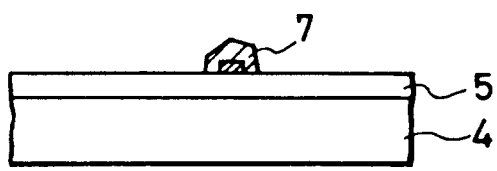
Figure 10C:
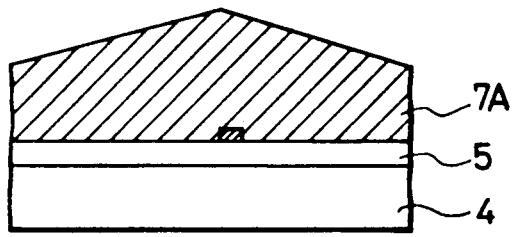
Figure 10D:
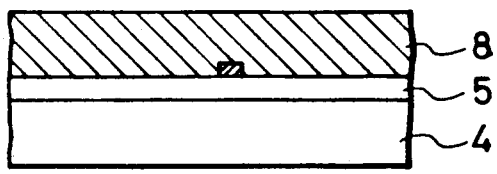
Figure 11A:
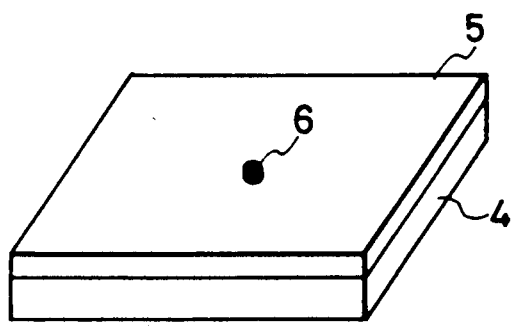
FIGS. 11A and 11B are perspective views of the substrate in FIGS. 10A to 10D.
Figure 11B:
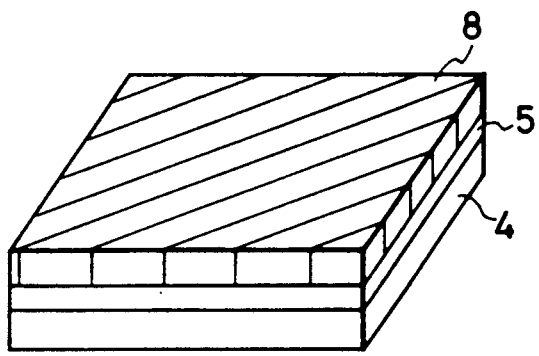

FIGS. 10A to 10D are illustrations of the formation steps showing a first embodiment of the method for forming crystal relating to the present invention, and FIGS. 11A and 11B are perspective views of the substrates in FIGS. 10A and 10D. First, as shown in FIG. 10A and FIG. 10A, on the substrate 4, a thin film 5 [deposition surface (S$_{NDS}$)] with small nucleation density which enables selective deposition is formed and a material different from the material forming the thin film 5 with greater nucleation density is deposited thinly, followed by patterning according to lithography, etc., to form sufficiently finely deposition surface 6 (S$_{NDL}$) (or called "Seed") comprising a different kind of material. However, the size, the crystal structure and the composition of the substrate 4 may be any desired ones, and a substrate having a functional device formed thereon prepared according to conventional semiconductor technique may be employed. Also, the deposition surface (S$_{NDL}$) 6 comprising a different kind of material is also inclusive of modified regions having excessive Si or N formed by ion implantation of Si or N into the thin film 5 as described above.

Next, by selection of appropriate deposition conditions, a single crystal of a thin film material is formed only on the deposition surface (S$_{NDL}$) 6. That is, the deposition surface (S$_{NDL}$) 6 is required to be formed sufficiently finely so that only a single nucleus may be formed thereon. The size of the deposition surface (S$_{NDL}$) 6, which may differ depending on the kind of the material, may be several microns or less. Further, the nucleus grows while maintaining a single crystal structure to become a single crystal grain 7 in shape of an island as shown in FIG. 10B. For forming an island-shaped single crystal grain 7, it is desirable to determine the conditions so that no nucleation may occur at all on the thin film 5, as already mentioned.

The island-shaped single crystal grain 7 further grows while maintaining the single crystal structure with the deposition surface (S$_{NDL}$) 6 as the center (lateral overgrowth), whereby it can cover over the whole thin film 5 as shown in FIG. 10C (single crystal 7A).

Subsequently, if necessary, the single crystal 7A is flattened by etching or polishing, and a single crystal layer 8 capable of forming a desired device can be formed on the thin film 5 as shown in FIG. 10D and FIG. 11B.

For forming thus the thin film 5 forming the nonnucleation surface (S$_{NDS}$) on the substrate 4, any desired material can be used for the substrate 4 which is the supporting member. Further, in such a case, even when the substrate 4 may be one having a functional device, etc., formed thereon according to conventional semiconductor technique, the single crystal layer 8 can be easily formed thereon.

In the above embodiment, the nonnucleation surface (S$_{NDS}$) is formed of thin film 5, but a substrate comprising a material with small nucleation density (ND) enabling selective nucleation may be used as such and nucleation surfaces (S$_{NDL}$) may be provided at any desired positions to form single crystal layers similarly thereon.

Figure 12:
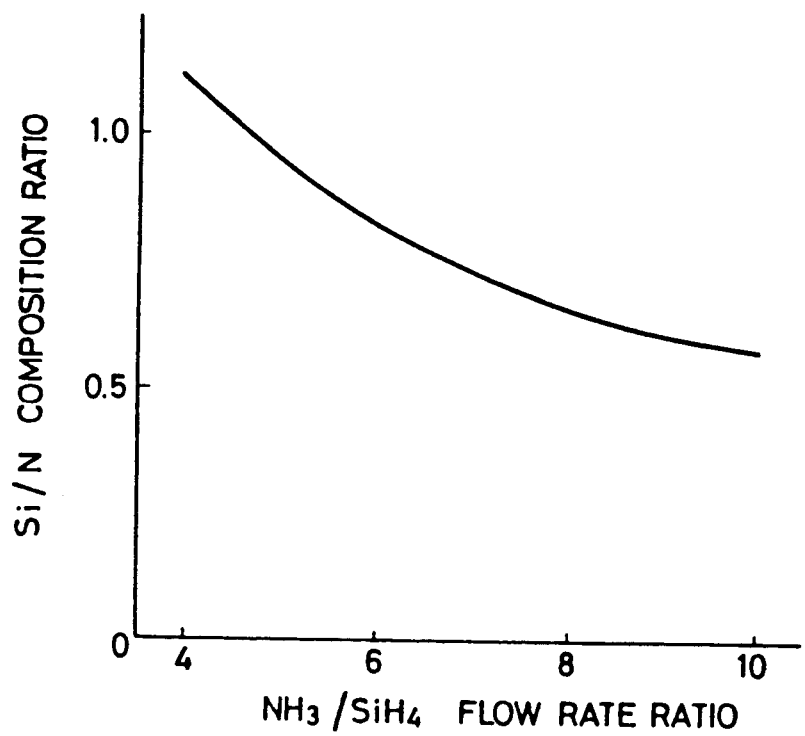
FIG. 12 is a graph showing the relationship between the flow rate of $SiH_4$ and $NH_3$ and the composition ratio of Si and N in the silicon nitride film formed.

FIG. 12 is a graph showing an example of the relationship between the flow rate ratio of SiH$_4$ and NH$_3$ and the composition ratio of Si and N in the silicon nitride film formed.

The deposition conditions at this time were RF output of 175 W, substrate temperature of 380° C. and the flow rate of NH$_3$ gas was varied with the SiH$_4$ gas flow rate being fixed at cc/min. As shown in the same graph, by varying the gas flow rate ratio of NH$_3$/SiH$_4$ from 4 to 10, the Si/N ratio in the silicon nitride film was found to be varied from 1.1 to 0.58 according to Auger's electron spectrophotometry.

On the other hand, the composition of the silicon nitride film formed according to the reduced pressure CVD method by introducing SiH$_2$Cl$_2$ gas and NH$_3$ gas under the conditions of a reduced pressure of 0.3 Torr and a temperature of about 800° C. was found to be Si$_3$N$_4$ (Si/N=0.75) which is approximately the stoichiometric ratio.

Also, the silicon nitride film formed by heat treatment at about 1200° C. in ammonia or N$_2$ (hot nitrification method) can be obtained with a composition further approximate to the stoichiometric ratio, since the formation method is performed under thermal equilibrium.

By use of silicon nitrides formed by the various methods as described above as the material for forming nucleation surface (S$_{NDL}$) with higher nucleation density than SiO$_2$, the above nucleus of Si can be grown on the nucleation surface (S$_{NDL}$) comprising silicon nitride to form Si single crystal based on the nucleation density ($\Delta$ND) corresponding to the chemical composition ratio of silicon nitride.

Figure 13:
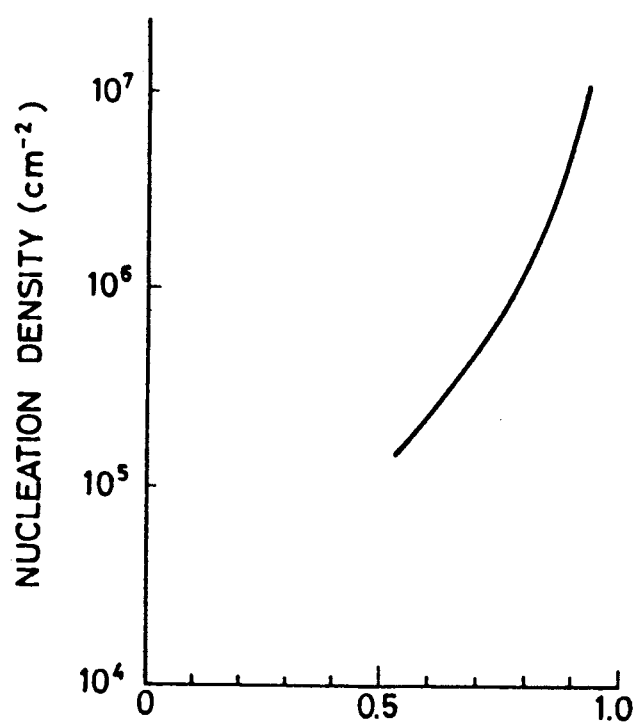
FIG. 13 is a graph showing the relationship between Si/N composition ratio and nucleation density.

FIG. 13 is a graph showing the relationship between Si/N composition ratio and nucleation density ($\Delta$ND). As shown in the same graph, by varying the chemical composition ratio of the silicon nitride film, the nucleation density of the Si single crystal nucleus formed thereon changes to a great extent. The nucleation conditions in the graph shown in FIG. 13 correspond to the case when Si single crystal nucleus was formed by reacting SiCl$_4$ gas reduced to 175 Torr with H$_2$ at 1000° C.

Of course, another graph will be obtained if nucleation conditions such as gas species, pressure, temperature, etc., are changed.

The phenomenon that the nucleation density thus changes according to the chemical composition ratio of silicon nitride affects the size (area) of the nucleation surface ($S_{NDL}$) when employing silicon nitride as the material for forming the nucleation surface ($S_{NDL}$) which is formed sufficiently finely to the extent that a single nucleus may be grown. That is, when employing silicon nitride having a composition with great nucleation density (ND) only a single crystal can be formed on the nucleation surface ($S_{NDL}$) by forming the nucleation surface ($S_{NDL}$) extremely finely as compared with the silicon nitride with relatively smaller nucleation density (ND). Such a point is applicable as a similar tendency for other materials for forming nucleation surface ($S_{NDL}$). Accordingly, in the present invention, for accomplishing its objects effectively, it is desirable to select a nucleation density (ND) and a size of nucleation surface ($S_{NDL}$) formed of silicon nitride, etc., capable of forming only a single crystal suitably as desired. For example, under the nucleation condition for obtaining a nucleation density (ND) of about $10^5 \, cm^{-2}$ or less, it is possible to form selectively, only a single nucleus, if the size of the nucleation surface ($S_{NDL}$) comprising silicon nitride is about 4 $\mu m$ or less. The Si/N ratio in that case is about 0.5.

Formation of nucleation surface ($S_{NDL}$) by ion implantation

As another method for realizing nucleation density difference when forming Si single crystal nucleus, ion implantation of Si, N, P, B, F, Ar, He, C, As, Ga, Ge, etc., may be effected locally onto the surface comprising $SiO_2$ which is a material for forming nonnucleation surface ($S_{NDS}$) with smaller nucleation density to form a modified region with a desired size on the $SiO_2$ surface, and utilize this modified region as the nucleation surface ($S_{NDL}$) with greater nucleation density (ND).

For example, the $SiO_2$ layer surface is covered with a photoresist layer and the desired portions are exposed, developed and dissolved to have the $SiO_2$ layer surface exposed.

Subsequently, by use of $SiF_4$ gas as the source gas, Si ions are implanted onto the $SiO_2$ layer surface exposed at 10 keV at a density of $1\times10^{16} \sim 1\times10^{18} \, cm^{-2}$. The projected flying distance in this case is 114 Å, and the Si concentration on the exposed surface of $SiO_2$ layer reaches about $10^{22} \, cm^{-3}$ or less. Since the $SiO_2$ layer is originally amorphous, the modified layer made excessively enriched in Si by implantation of Si ions is also amorphous.

For formation of a modified region, ion implantation can be effected with the use of a resist as the mask, but it is also possible to inject a narrowed Si ion beam selectively at a desired position on the $SiO_2$ layer surface within a desired area without use of a resist mark by use of converged ion beam technique.

After having thus effected Si ion implantation, by peeling of the resist on the remaining portion, Si-excessive modified region is formed on the $SiO_2$ layer surface at a desired position with a desired size. On the modified region of the $SiO_2$ layer surface having such modified region formed, Si single crystal is permitted to grow in vapor phase.

Figure 14:
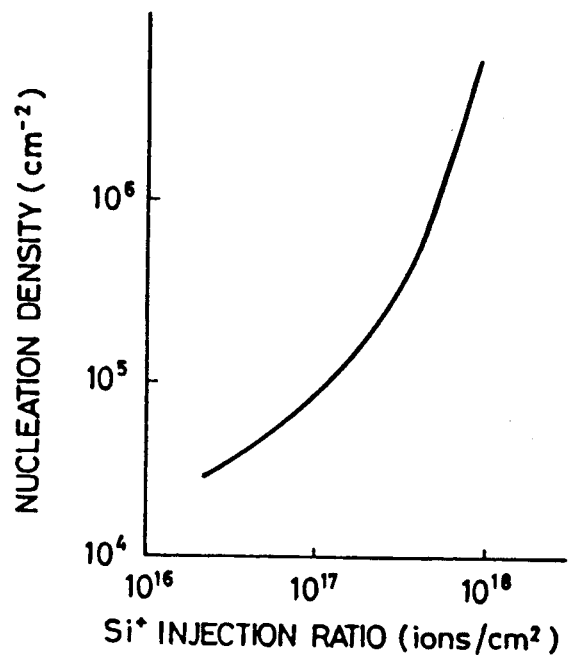
FIG. 14 is a graph showing the relationship between the injected amount of Si ions and nucleation density.

FIG. 14 is a graph showing the relationship between amount of Si ions implanted and nucleation density (ND).

As shown in the same graph, it can be understood that nucleation density (ND) is increased as the amount of $Si^+$ implanted increases.

Accordingly, by forming a modified region sufficiently finely, only a single nucleus of Si can be grown with the modified region being as the nucleation surface ($S_{NDL}$), whereby a single crystal can be grown as described above.

It can be easily accomplished by patterning of a resist or narrowing of beam of the converged ion beam to form sufficiently finely the modified region to the extent that only a single nucleus may grow.

Method for formation of Si single crystal nucleus other than CVD

For growth of single crystal by selective nucleation of Si, not only the CVD method, but also the method by evaporation of Si into vacuum ($<10^{-6}$ Torr) with an electron gun and deposition on a heated substrate may be used. Particularly, in the MBE (Molecular Beam Epitaxy) method which performs vapor deposition in ultra-high vacuum ($<10^{-9}$ Torr), it has been known that Si beam begins to react with $SiO_2$ at a substrate temperature of 900° C. or higher, whereby no nucleation of Si occurs on $SiO_2$ at all (T. Yonehara, S. Yoshioka and S. Miyazawa, Journal of Applied Physics 53, 10, p. 6839, 1982).

By utilizing this phenomenon, single crystal nuclei of Si can be formed with perfect selectivity on the fine silicon nitride regions permitted to exist in spots on the $SiO_2$ layer, and single crystal Si can be grown thereon. The single crystal growth conditions as preferable example at this time may be, for example, a vacuum degree of $10^{-8}$ Torr or lower, Si beam intensity of $9.7 \times 10^{14}$ atoms/$cm^2$.sec, and a substrate temperature of 900° C. $\sim$ 1000° C.

In this case, through the reaction $SiO_2 + Si \rightarrow 2SiO \uparrow$, a reaction product of SiO with a remarkably high vapor pressure is formed, and etching of $SiO_2$ itself with Si through this evaporation occurs.

In contrast, no such etching phenomenon as mentioned above occurs on silicon nitride, but nucleation of Si single crystal and growth of single crystal occur.

Accordingly, as the material for forming nucleation surface ($S_{NDL}$) with high nucleation density (ND), tantalum oxide ($Ta_2O_5$), silicon nitride oxide (SiON), etc., can be also used other than silicon nitride to obtain the same effect. That is, by forming the above nucleation surface ($S_{NDL}$) with these materials in fine areas, single crystals of Si can be permitted to grow similarly.

Figure 15A:
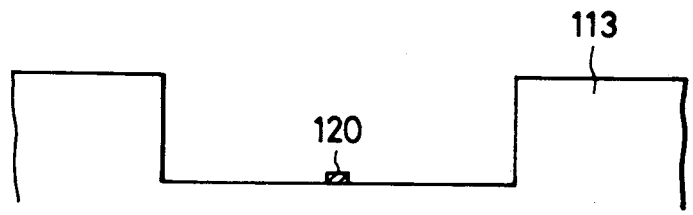
FIGS. 15A-15C are illustrations of the steps of forming a single crystal silicon and a transistor in the embodiments of this invention.
Figure 15B:
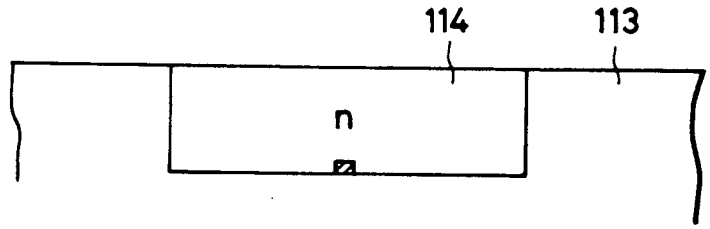
Figure 15C:
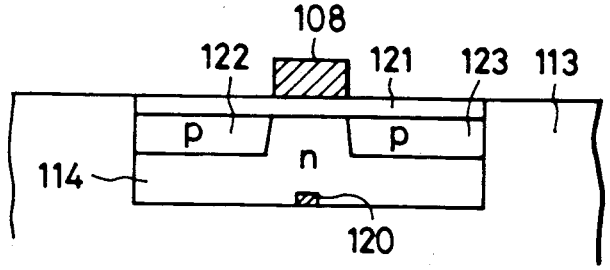

As described above, a single crystal silicon layer is formed in each of recesses in insulating layers 113 of the embodiments by using the single crystal growth method as described above. FIGS. 15A-15C illustrate the steps of forming a single crystal silicon and forming a transistor in the respective embodiments.

In FIG. 15A, a recess is formed in insulating layer 113 of $SiO_2$ by etching and a small area of a different material 120 (here, $Si_3N_4$) is formed in the recess.

Then, an n-type impurity gas is mixed to grow a single crystal silicon to fill the recess with n-type single crystal silicon as shown in FIG. 15B, and the resulting area is flattened to form n-type single crystal silicon layer 114.

As shown in FIG. 15C, a gate oxide film 121 is then formed on single silicon layer 114, and gate electrode 108 is patterned with a material such as polysilicon or the like.

P type impurity ions are then implanted using gate electrode 108 as a mask and source and drain areas 122 and 123 are then formed by subsequent thermal treatment.

As described above in detail, according to this embodiment, switching means for setting the control electrode area to a desired potential is formed on a layer different from that on which a transistor and a capacitor are formed, so that accomplishment of a minuter structure can be expedited although many terminals must be provided thereon, thereby providing a device of increased density and resolution.

It is to be noted that switching means in this invention includes semiconductor switching devices such as field effect transistors, bipolar transistors or pn-junction diodes.

We claim:

1. A method for forming a photoelectric conversion apparatus comprising a semiconductor substrate provided with a photoresponsive transistor, the photoresponsive transistor having an emitter region, a collector region, and a base region, the base region being allowed to float to store therein photo-excited carriers; the method comprising the steps of:

forming an electrically insulating layer disposed on said semiconductor substrate;

forming an amorphous nucleation surface on the electrically insulating layer, wherein the nucleation surface has a nucleation density larger than that of the surface of the electrically insulating layer;

forming a semiconductor region corresponding to the nucleation surface by a vapor deposition, wherein the nucleation surface is sufficiently fine to permit the semiconductor region to be formed as a single crystal; and forming a semiconductor switching means within the semiconductor region for setting a potential of the base region at a predetermined level.

2. A method according to claim 1, wherein said semiconductor region is silicon, said insulating layer is silicon oxide, and said nucleation surface is made of silicon nitride.

3. A method according to claim 1, wherein said semiconductor layer is silicon, said insulating layer is silicon oxide, and said nucleation surface formed by means of an ion implantation process.

4. A method for forming a photoelectric conversion apparatus comprising a semiconductor substrate provided with a photoresponsive transistor, the photoresponsive transistor including a main electrode region of a first semiconductor having a first conductivity type and a control electrode region of a second semiconductor having a second conductivity type different from the first conductivity type, the control electrode region being allowed to float to store therein photo-excited carriers; the method comprising the steps of:

forming an electrically insulating layer disposed on said semiconductor substrate;

forming an amorphous nucleation surface on the electrically insulating layer, wherein the nucleation surface has a nucleation density larger than that of the surface of the electrically insulating layer;

forming a semiconductor region corresponding to the nucleation surface by vapor deposition, wherein the nucleation surface is sufficiently fine to permit the semiconductor region to be formed as a single crystal; and forming semiconductor switching means within the semiconductor region for setting a potential of the base region at a predetermined level.

5. A method according to claim 4, wherein said semiconductor region is silicon, said insulating layer is silicon oxide, and said nucleation surface is made of silicon nitride.

6. A method according to claim 4, wherein said semiconductor layer is silicon, said insulating layer is silicon oxide, and said nucleation surface formed by means of an ion implantation process.

* * * * *

UNITED STATES PATENT AND TRADEMARK OFFICE
CERTIFICATE OF CORRECTION

PATENT NO. : 5,008,206

DATED : April 16, 1991

INVENTOR(S) : MAHITO SHINOHARA, ET AL.

It is certified that error appears in the above-identified patent and that said Letters Patent is hereby corrected as shown below:

SHEET 4 OF 9

FIG. 4B, "CARACITOR ECECTRODE 109" should read --CAPACITOR ELECTRODE 109--.

SHEET 5 OF 9

FIG. 6B, "ECECTRODE 111" should read --ELECTRODE 111--.

COLUMN 1

Line 55, "positive" (first occurrence) should be deleted.

COLUMN 2

Line 16, "electrode 101" should read --electrode 108--.

COLUMN 5

Line , "nuclei"." should read --nucleus".-- and "nucleus"," should read --nuclei",--.

COLUMN 7

Line 39, "and FIG. 10A," should be deleted.

UNITED STATES PATENT AND TRADEMARK OFFICE
CERTIFICATE OF CORRECTION

PATENT NO. : 5,008,206

DATED : April 16, 1991

INVENTOR(S) : MAHITO SHINOHARA, ET AL.

It is certified that error appears in the above-identified patent and that said Letters Patent is hereby corrected as shown below:

COLUMN 12

Line 10, "formed" should read --is formed--.
Line 42, "formed" should read --is formed--.

Signed and Sealed this

Fifth Day of January, 1993

Attest:

DOUGLAS B. COMER

Attesting Officer

Acting Commissioner of Patents and Trademarks